United States Patent
Ahn et al.

(10) Patent No.: US 7,659,566 B2
(45) Date of Patent: Feb. 9, 2010

(54) METHOD OF FABRICATING A RESISTANCE BASED MEMORY DEVICE AND THE MEMORY DEVICE

(75) Inventors: Seung-eon Ahn, Suwon-si (KR); Hye-young Kim, Seongnam-si (KR); Byoung-ho Park, Seoul (KR); Jung-bin Yun, Yongin-si (KR); You-seon Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 325 days.

(21) Appl. No.: 11/501,880

(22) Filed: Aug. 10, 2006

(65) Prior Publication Data
US 2007/0037351 A1  Feb. 15, 2007

(30) Foreign Application Priority Data
Aug. 11, 2005  (KR) .............. 10-2005-0073816

(51) Int. Cl.
*H01L 27/108* (2006.01)
(52) U.S. Cl. ............ 257/298; 257/E21.209; 257/E21.211; 257/E21.662
(58) Field of Classification Search ........... 257/68, 257/296, 314, 298, E21.209, E21.211, E21.662
See application file for complete search history.

(56) References Cited

U.S. PATENT DOCUMENTS

2006/0034022 A1*  2/2006  Fukuzawa et al. ........ 360/324.1
2007/0235710 A1* 10/2007  Matsuzaki et al. ............ 257/4

\* cited by examiner

*Primary Examiner*—Quoc D Hoang
(74) *Attorney, Agent, or Firm*—Harness, Dickey & Pierce, P.L.C.

(57) ABSTRACT

Example embodiments relate to a method of fabricating a memory device and a memory device. The method of fabricating a memory device comprises forming a lower electrode and an oxide layer on a lower structure and radiating an energy beam on a region of the oxide layer. The memory device comprises a lower structure and an oxide layer and a lower structure formed on the lower structure, the oxide layer including an electron beam radiation region that received radiation from an electron beam source creating an artificially formed current path through the oxide layer to the lower electrode. A reset current of the memory device may be decreased and stabilized.

4 Claims, 4 Drawing Sheets

US 7,659,566 B2

METHOD OF FABRICATING A RESISTANCE BASED MEMORY DEVICE AND THE MEMORY DEVICE

PRIORITY STATEMENT

This application claims priority under 35 U.S.C. § 119 to Korean Patent Application No. 10-2005-0073816, filed on Aug. 11, 2005, in the Korean Intellectual Property Office (KIPO), the entire contents of which are incorporated herein by reference.

BACKGROUND

1. Field

Example embodiments relate to a method of fabricating a memory device and the memory device.

2. Description of the Related Art

As a semiconductor memory device must have a higher integration density, (e.g., a larger number of memory cells per area), a faster operating speed, and operate with less power consumption, research has been conducted and various kinds of memory devices have been developed. A semiconductor memory device may include many memory cells connected in circuits. In a dynamic random access memory (DRAM), which is a typical semiconductor memory device, a unit memory cell normally consists of one switch and one capacitor. The DRAM may have a higher integration density and a faster operating speed. The DRAM, however, may lose all stored data when the power is shut down.

On the contrary, a typical example of a nonvolatile memory device, in which stored data may be retained even when the power is shut down, is a flash memory device. The flash memory device has a nonvolatile property unlike a volatile memory device, but may have a lower integration density and a slower operating speed compared to the DRAM. Some examples of nonvolatile memory devices that are currently being developed are a magnetic random access memory (MRAM), a ferro-electric random access memory (FRAM) and/or a phase-change random access memory (PRAM). The MRAM stores data using the change of direction of a magnet in a tunnel junction and the FRAM stores data using a polarity property of ferroelectrics. The MRAM and FRAM may have a higher integration density, a faster operating speed, and an ability to operate with less power. The MRAM and FRAM are also being studied and developed to have improved data retention characteristics.

The PRAM stores data using a change in resistance value in accordance with the phase change of a specific material and includes one resistor and one switch (transistor). The resistor used for the PRAM may be a chalcogenide resistor and may have a crystal structure or an amorphous structure by controlling a formation temperature. Because resistance in the amorphous structure is greater than that in the crystal structure, a memory device may be fabricated using these characteristics. When a conventional DRAM process is used in the fabrication of the PRAM, an etching operation may be more difficult and may take a longer time to etch. Productivity may be decreased and the price may increase.

A resistance random access memory (RRAM) may use a transition metal oxide layer as a data storage layer and the resistance value may change in accordance with an applied voltage (e.g., resistance variation characteristics). FIGS. 1A and 1B are diagrams illustrating a typical structure of a RRAM and an artificially current path created in an oxide layer by an applied voltage.

Referring to FIGS. 1A and 1B, an oxide layer 12 and an upper electrode 13 may be formed on a lower electrode 11. The lower electrode 11 and the upper electrode 13 may be composed of a metal (e.g., Ir, Ru, Au, Pt and/or an oxide thereof). The oxide layer 12 may be composed of a transition metal oxide having resistance variation (variable resistance) characteristics. The oxide layer 12 may function as a data storage layer, and by applying a voltage to the oxide layer 12 through the lower electrode 11 and the upper electrode 13, data may be written or recorded data may be read.

When a voltage is applied through the lower electrode 11 and the upper electrode 13, a current may be flowed in the oxide layer 12 by a potential difference. The current may not be distributed evenly in all portions, but may be distributed to form a transient current path 10 inside the oxide layer 12 through crystal grains. As the transient current path 10 formed inside the oxide layer 12 is formed at random, even though the same voltage is applied to the lower electrode 11 and the upper electrode 13, a formation position of the current path 10 and the formation number thereof may change.

FIG. 2 is a graph illustrating a current value in accordance with an applied voltage when a voltage is applied to a memory device including an oxide layer composed of a typical resistance variation material. Particularly, FIG. 2 is a graph illustrating a current flowing through an oxide layer 12 when a given voltage is applied to a lower electrode 11 and an upper electrode 13 of a RRAM having the same structure as that in FIG. 1A. The oxide layer 12 may be composed of nickel oxide (NiO) and the lower electrode 11 and the upper electrode 13 may be composed of Pt.

Referring to FIG. 2, as the voltage applied through the lower electrode 11 and the upper electrode 13 is gradually increased from about 0 V, and when the current value flowing through the oxide layer 12 is measured, the current values may not be the same in every measurement and show slight differences between them. A reset current (RC) may illustrate a difference of ten times even at the same applied voltage, and a set voltage (SV) may not be maintained the same either. As above, as the reset current is unstable and shows a higher value, a reliability of a memory device may be deteriorated and a consumed power may be increased.

SUMMARY

According to the example embodiments, there is provided a method of fabricating a memory device comprising forming a lower electrode and an oxide layer on a lower structure; and radiating an energy beam on a region of the oxide layer. The energy beam may be an electron beam or an ion beam. The resistance variation material may include at least one material among NiO, $TiO_2$, HfO, ZrO, ZnO, $WO_3$, CuO, CoO and/or $Nb_2O_5$. The lower structure may also include a substrate in which a source and a drain are formed; a gate insulating layer and a gate electrode layer formed on the substrate in contact with the source and drain; and a conductive plug connected to at least one of the source and drain, and the lower electrode.

The method may further include radiating an electron beam on the oxide layer so as to form an upper electrode on the oxide layer. The electron beam may be radiated on the region of the oxide layer by an accelerating voltage of about 25 keV or lower (e.g., about 10 keV to about 20 keV). The lower electrode may be composed of a conductive material including a metal (e.g., Al, Au, Pt, Ru, Ir, Ti, and/or metal oxide). The electron beam may be continuously radiated on the region of the oxide layer, or radiated intermittently as a pulse on the region of the oxide layer. The method may further include providing a switch that selectively writes or reads data by applying voltage to the oxide layer. The switch may include of a transistor and a diode.

According to other example embodiments, there is provided a memory device comprising a lower structure and an oxide layer and a lower structure formed on the lower structure, the oxide layer including a radiation region forming an artificial current path to the lower electrode. The lower structure may include a substrate in which a source and a drain are formed, a gate insulating layer and a gate electrode layer formed on the substrate in contact with the source and drain, and a conductive plug connected to at least one of the source and drain and the lower electrode. The memory device may further comprise an upper electrode formed by radiating an electron beam on the oxide layer. The lower structure may further comprise first and second impurity regions formed on the substrate, an interlayer insulating layer formed on the entire surface of the substrate, the gate electrode layer and the gate insulating layer, a hole formed from etching the interlayer insulating layer in order to expose the second impurity region and a conductive material deposited in the hole.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

FIG. 2 is a graph illustrating current values in accordance with applied voltages when voltage is applied to a conventional memory device including an oxide layer composed of a resistance variation material;

FIG. 3 is a diagram illustrating a memory device including an oxide layer composed of a resistance variation material formed on a transistor structure according to example embodiments;

FIG. 4 is a diagram illustrating an electron beam radiated on a portion of an oxide layer in the method of fabricating a memory device according to example embodiments;

FIG. 5 is a diagram illustrating an artificial current path created in an oxide layer when voltage is applied to a memory device fabricated according to example embodiments;

FIG. 6 is a graph illustrating current values in accordance with applied voltages when voltage is applied to an oxide layer of a memory device fabricated according to example embodiments; and FIG. 7 is a graph illustrating electrical characteristics of a memory device including a resistance variation material.

DETAILED DESCRIPTION OF THE EXAMPLE EMBODIMENTS

Figure 1A:
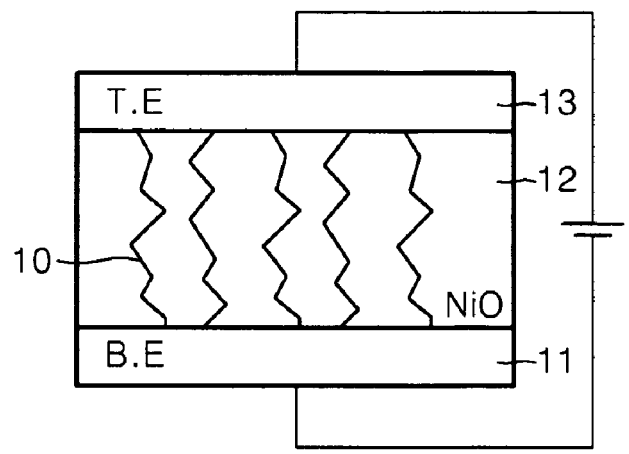
FIGS. 1A and 1B are diagrams respectively illustrating a current path formed in an oxide layer when current is applied to a conventional memory device including an oxide layer composed of a resistance variation material.

Hereinafter, a method of fabricating a memory device according to the example embodiments will now be described more fully with reference to the accompanying drawings, in which example embodiments are shown. In the drawings, the thicknesses of layers and regions are exaggerated for clarity.

Spatially relative terms, such as "beneath," "below," "lower," "above," "upper" and the like, may be used herein for ease of description to describe one element or a feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A lower electrode and an oxide layer may be sequentially formed on a lower structure. An energy beam (i.e., electron beam and/or ion beam) may be radiated on a portion of the oxide layer using an energy beam source (i.e., electron beam source and/or ion beam source) so as to create an artificial current path in the oxide layer and it may be possible to radiate the ion beam selectively. An upper electrode may then be formed on the oxide layer. The lower structure may be simply a substrate (e.g., a Si substrate) or it may be a device having switching characteristics. In order to operate the memory device, a voltage applying structure may be required. In the memory device according to the example embodiments, a switch may also be provided to write or read data by applying voltage to a data storage layer (e.g., an oxide layer). A basic structure may be a 1S (switch)-1R (resistor) structure. The switch may use a transistor or diode, but may not be limited to such.

Figure 3:
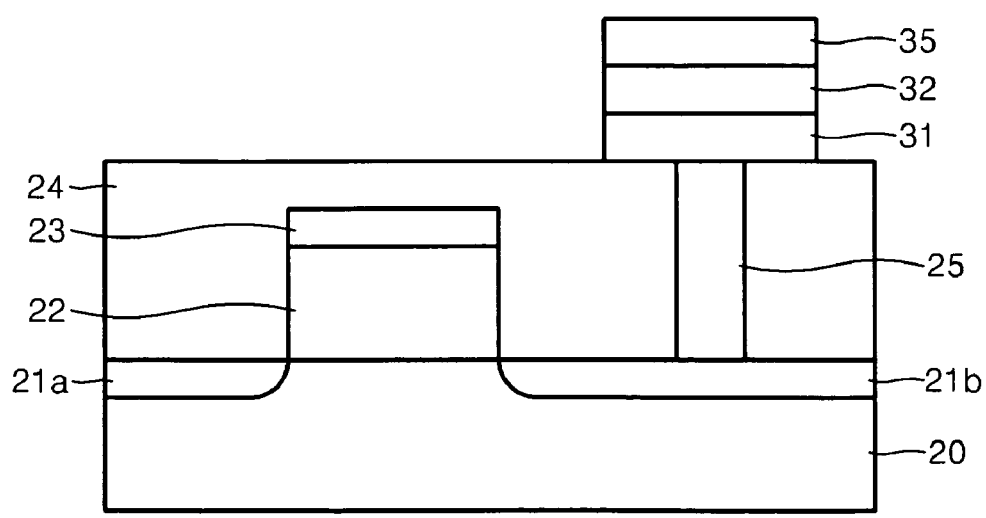

FIG. 3 is a diagram illustrating a transistor as a lower structure according to the example embodiments. Referring to FIG. 3, a gate insulating layer 22 and a gate electrode layer 23, forming a gate, may be sequentially formed on a substrate 20, and a first impurity region 21a and a second impurity region 21b may be formed. An interlayer insulating layer 24 may be formed on the entire surface of the substrate 20 and the gate. The interlayer insulating layer 24 may be etched so as to form a hole exposing the second impurity region 21b. A conductive material may be deposited in the hole so as to form a conductive plug 25, which may complete the formation of the lower structure. A physical vapor deposition (PVD) process (e.g., a sputtering process, an atomic layer deposition (ALD) process and/or a chemical vapor deposition (CVD) process) may be used.

As described above, after the lower structure is formed, a lower electrode 31, an oxide layer 32 and an upper electrode 33 may be sequentially formed on the lower structure. The lower electrode 31 may be composed of a metal (e.g., Al, Au, Pt, Ru, Ir, Ti and/or any other suitable metal) and/or a conductive material including metal oxide. The oxide layer 32 may be composed of a material having resistance variation characteristics, for example, a transition metal oxide (e.g., NiO, TiO$_2$, HfO, ZrO, ZnO, WO$_3$, CuO, CoO and/or Nb$_2$O$_5$).

Figure 4:
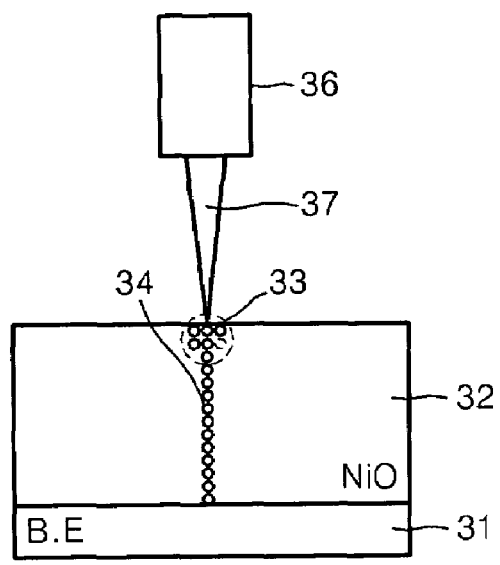

FIG. 4 is a diagram illustrating a process of creating an artificial current path in the oxide layer 32 by radiating an electron beam 37 from an electron beam applying structure, for example, an electron beam source 36 to a portion of the oxide layer 32.

Referring to FIG. 4, a portion of the surface of the oxide layer 32 may be defined as an electron beam radiation region 33 and the electron beam source 36 may be positioned toward the electron beam radiation region 33 so as to radiate an electron beam 37 thereon. A current 34 may be flowed through the oxide layer 32 to the lower electrode 31 by the radiation of the electron beam 37.

Figure 1B:
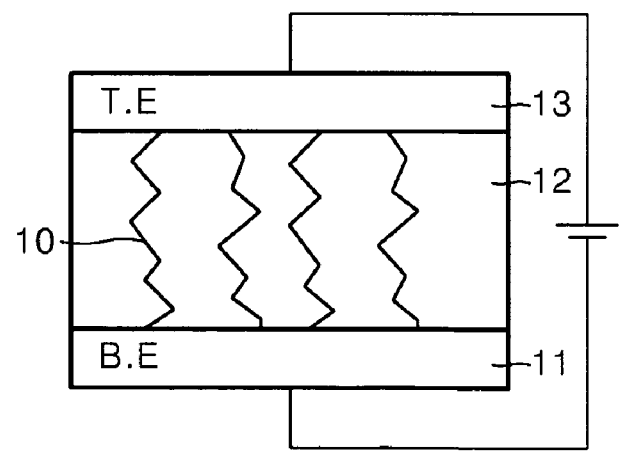

The electron beam radiation region 33 may be in a central region of the surface of the oxide layer 32 or around the central region as a local region on the surface of the oxide layer 32 and it may not be necessary to set a plurality of the electron beam radiation regions 33. When the number of the electron beam radiation regions 33 is increased, it may be difficult to control the current path such as illustrated in FIGS. 1A and 1B. The electron beam source 36 may use a field emission apparatus including a carbon nanotube and/or a conductive tip and it may be possible to use an apparatus for setting the electron beam radiation region more precisely, for example, a scanning microscope, an electron gun, an electron lens, an accelerator and/or a deflector. An ion beam may be used to form the current path in the oxide layer in addition to or alternatively the electron beam and an ion beam applying structure and may provide the same effects as that of the electron beam applying structure.

In the methods of radiating the electron beam 37 to the electron beam radiation region 33 on the surface of the oxide layer 32, there is a method of continuously radiating the electron beam for a given time and a method of radiating the electron beam with a pulse several times. An accelerating voltage to radiate the electron beam 37 may be varied in accordance with the type of the electron beam source 36. When an electron beam lithography apparatus is used, an accelerating voltage may be about 25 keV or less, for example, about 10 keV to about 20 keV. When the accelerating voltage is relatively high, it may be difficult to control the current path below the oxide layer 32, and when the accelerating voltage is relatively low, the current path may not be created inside the oxide layer 32. When the electron beam 37 is radiated on the electron beam radiation region 33 of the surface of the oxide layer 32 sufficiently, a current 34 may be flowed inside the oxide layer 32, and thus, a current path may be locally formed in the oxide layer 32 between the electron beam radiation region 33 and the lower electrode 31. After the current path is formed in the oxide layer 32, an upper electrode 35 may be formed on the oxide layer 32. The upper electrode 35 may be composed of a metal or a metal compound. For example, the upper metal electrode may be formed of, for example, Al, Au, Pt, Ru, Ir, Ti and/or any other suitable metal.

Figure 5:
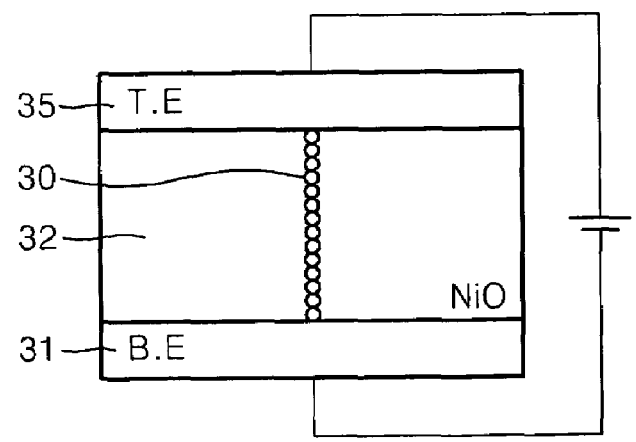

FIG. 5 illustrates the local current path 30 existing inside the oxide layer 32 when a given voltage is applied to the lower electrode 31 and the upper electrode 35 of the memory device fabricated according to example embodiments. Referring to FIG. 5, when a voltage is applied to the lower electrode 31 and the upper electrode 35, a potential difference may occur in the lower electrode 31 and the upper electrode 35, so that a current may be distributed. By the process illustrated in FIG. 4, most of the current may be distributed through the current path 30 formed between the electron beam radiation region 33 and the lower electrode 31.

Figure 6:
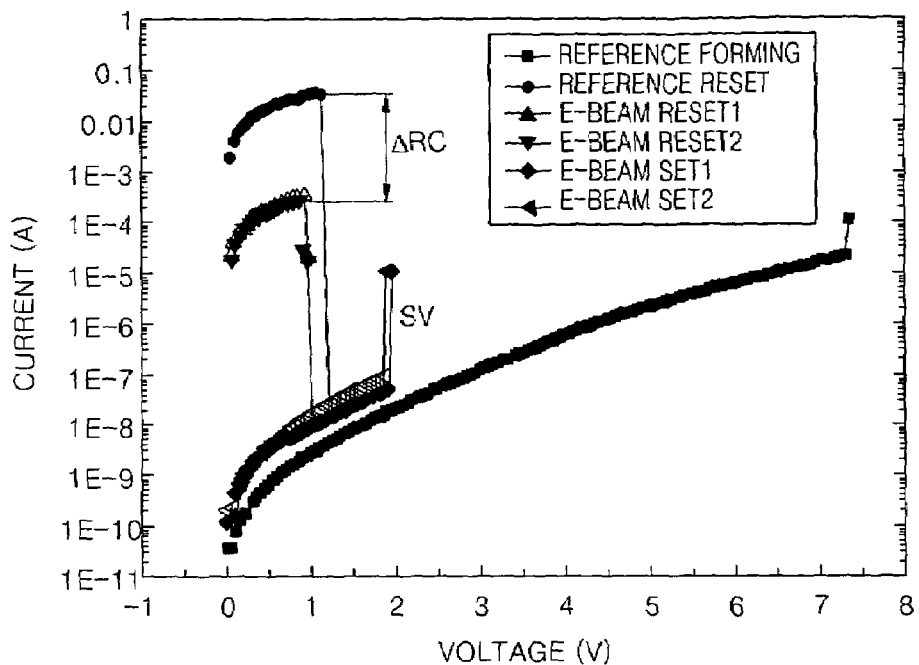

FIG. 6 is a graph illustrating current values flowing through the oxide layers of the memory device fabricated according to example embodiments and the conventional memory device when voltages are applied to the respective memory devices. In the sample indicated by 'reference' in FIG. 6, a lower electrode and an upper electrode may be formed respectively with a thickness of about 10 nm, an oxide layer may be formed with a thickness of about 50 nm under about 5% of an oxygen partial pressure, and a transverse width and a longitudinal width of the oxide layer may be about 30 μm.

In the sample indicated by 'E-beam' in FIG. 6, a lower electrode may be formed with a thickness of about 10 nm, an oxide layer may be formed with a thickness of about 50 nm under about 5% of an oxygen partial pressure, and a transverse width and a longitudinal width of the oxide layer may be about 30 μm. An electron beam radiation region with a diameter of about 100 nm may be set on the central portion of the surface of the oxide layer and an electron beam may be radiated on the region, using a probe tip as an electron beam source. After about 10 nA of current is flowed through the oxide layer for about 10 seconds, the radiation of the electron beam may form an upper electrode with a thickness of about 10 nm on the oxide layer.

Figure 2:
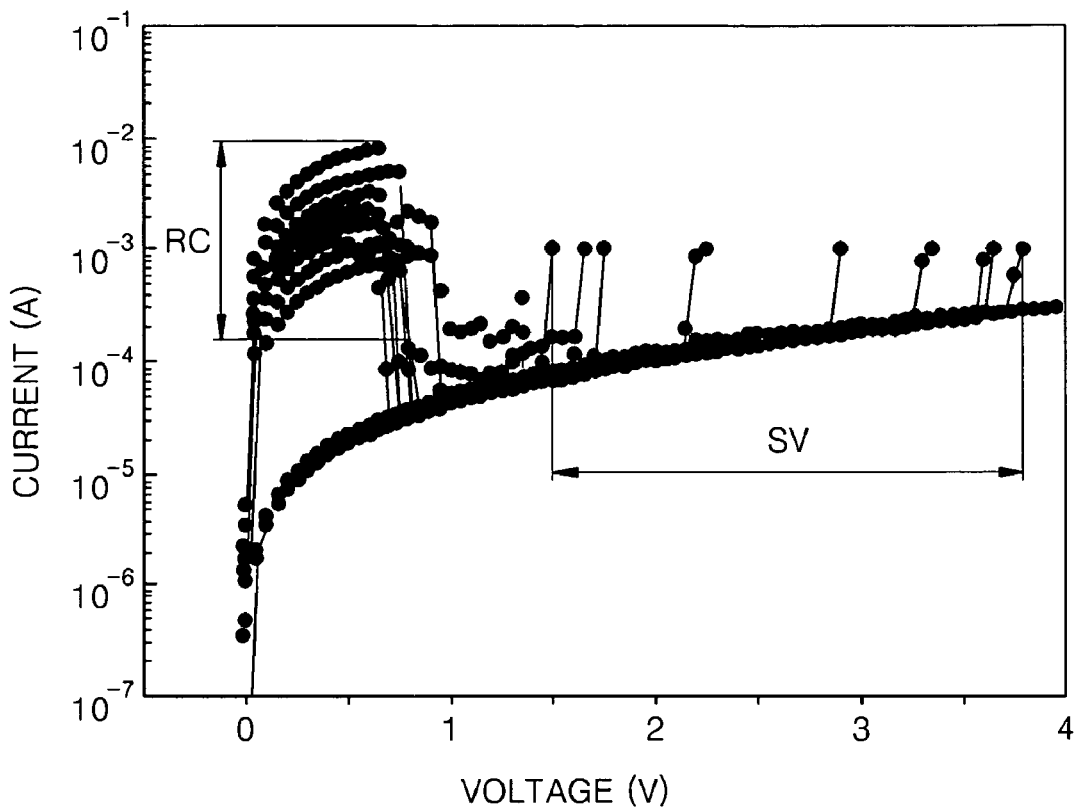

Referring to FIG. 6, a reset current of the sample indicated by 'reference' on which an electron beam is not radiated may be relatively high compared to a reset current of the sample (E-beam reset 1, E-beam reset 2) on which the electron beam is radiated. In the sample (reference) on which the electron beam is not radiated, a reset current may be measured only one time and variation of the reset current values may be relatively high every time they are measured as illustrated in FIG. 2. In the sample (E-beam reset 1, E-beam reset 2) on which the electron beam is radiated, reset current values are relatively close and show relatively stable values. A set voltage value of the sample (E-beam set 1, E-beam set 2) on which the electron beam is radiated is relatively low compared to that of the sample (reference) on which the electron beam is not radiated. Also, the set value of the sample (E-beam set 1, E-beam set 2) may show a constant value. When a set voltage is relatively low, consumed voltage may be reduced, and when a reset current is relatively low, it may be possible to use the memory device for stable applications.

Figure 7:
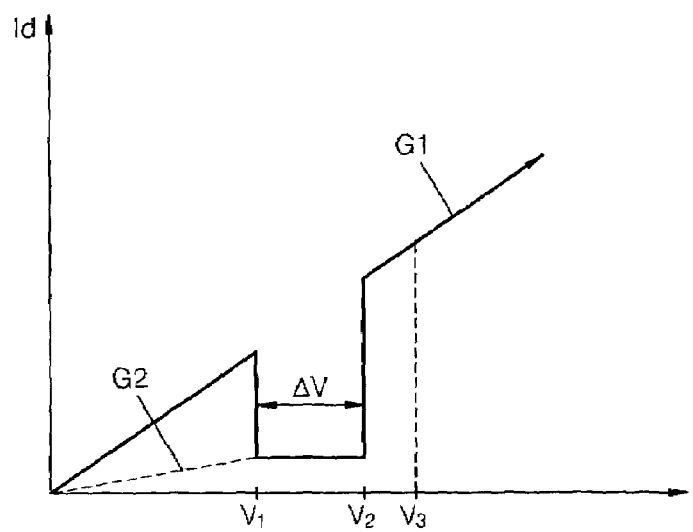

Further, operating characteristics of a memory device including a resistance variation material will be explained in reference to FIG. 7. FIG. 7 is a graph illustrating electrical characteristics of a memory device including a resistance variation material. A transverse axis presents an applied voltage and a longitudinal axis presents a current in accordance with an applied voltage.

Referring to FIG. 7, when a voltage is gradually increased from about 0 V, a current value is increased along a graph $G_1$ in proportion to the voltage. When a voltage of $V_1$ or higher is applied, a resistance is suddenly increased and a current value is decreased. In a range $V_1$-$V_2$ of an applied voltage, a current value is increased along a graph $G_2$. When a voltage of $V_2$ ($V_2$>$V_1$) or higher is applied, a resistance is suddenly reduced and a current is increased along the graph $G_1$ again.

In the meantime, the electrical characteristics of the memory device in accordance with a voltage applied in a range greater than $V_1$ influences the electrical characteristics of the memory device when a voltage lower than $V_1$ is applied. After a voltage with a range of $V_1$-$V_2$ is applied to a memory device (i.e., set state), when a voltage lower than $V_1$ is applied, measured current values follow a graph $G_2$. After a voltage greater than $V_2$ (for example, $V_3$) is applied to a memory device (I.e., reset state, when a voltage lower than $V_1$ is applied again, measured current values follow a graph $G_1$ of FIG. 7. If a voltage lower than $V_1$ is applied, measured current values are not constant. When the current values are different as illustrated in FIG. 2, it is more difficult to clearly distinguish if the memory is in a set state or a reset state and the memory device is not reliable. When the reset current is stabilized according to the example embodiments, it may be easier to distinguish the set state and a consumed voltage may be reduced by decreasing a set voltage value.

A reset current value of a memory device using a resistance variation material may be decreased and stabilized, thereby to reduce power consumption and ensure reliability of a memory device. Variation of set voltages may be improved and stabilized, thereby to ensure reliability in operating control of a memory device. An electron beam source may use a wide range of field emission apparatuses.

While the example embodiments have been particularly shown and described with reference to exemplary embodiments thereof, it will be understood by those of ordinary skill in the art that various changes in form and details may be made therein without departing from the spirit and scope of the invention.

What is claimed is:

1. A memory device, comprising:
    a lower structure; and
    a data storage layer and a lower electrode formed on the lower structure, the data storage layer formed of a transition metal oxide having resistance variation characteristics and including a radiation region electrically connected to the lower electrode by an artificial current path.

2. The memory device of claim 1, wherein the lower structure includes:
    a substrate in which a source and a drain are formed;
    a gate insulating layer and a gate electrode layer formed on the substrate in contact with the source and drain; and
    a conductive plug connected to at least one of the source and drain, and the lower electrode.

3. The memory device of claim 2, wherein the lower structure further comprises:
    first and second impurity regions formed on the substrate;
    an interlayer insulating layer formed on the entire surface of the substrate, the gate electrode layer and the gate insulating layer;
    a hole formed from etching the interlayer insulating layer in order to expose the second impurity region; and
    a conductive material deposited in the hole.

4. The memory device of claim 1, further comprising:
    an upper electrode formed on the data storage layer.

* * * * *